(12) United States Patent
Majcherczak et al.

(10) Patent No.: US 7,829,958 B2
(45) Date of Patent: Nov. 9, 2010

(54) MOS TRANSISTOR CAPABLE OF WITHSTANDING SIGNIFICANT CURRENTS

(75) Inventors: Sandrine Majcherczak, Saint Pierre d'Allevard (FR); Carlo Tinella, Pavia (IT); Olivier Richard, Coublevie (FR); Andreia Cathelin, Laval (FR)

(73) Assignee: STMicroelectronics S. A., Montrouge (FR)

( * ) Notice: Subject to any disclaimer, the term of this patent is extended or adjusted under 35 U.S.C. 154(b) by 0 days.

(21) Appl. No.: 11/964,438

(22) Filed: Dec. 26, 2007

(65) Prior Publication Data

US 2008/0157226 A1 Jul. 3, 2008

(30) Foreign Application Priority Data

Dec. 27, 2006 (FR) .................................. 06 55981

(51) Int. Cl.
*H01L 27/088* (2006.01)
(52) U.S. Cl. ................. 257/401; 257/341; 257/342
(58) Field of Classification Search ................. 257/758, 257/759, 760, 774, 776, 341, 342, 401
See application file for complete search history.

(56) References Cited

U.S. PATENT DOCUMENTS

| | | | |
|---|---|---|---|
| 4,298,879 A | | 11/1981 | Hirano |
| 5,283,452 A | | 2/1994 | Shih et al. |
| 5,614,762 A | * | 3/1997 | Kanamori et al. ............. 257/69 |
| 7,446,417 B2 | * | 11/2008 | Yoshioka ..................... 257/758 |
| 2002/0167088 A1 | * | 11/2002 | Hoshino et al. ............. 257/758 |
| 2004/0048463 A1 | | 3/2004 | Haematsu |

FOREIGN PATENT DOCUMENTS

| | | |
|---|---|---|
| JP | 61104674 | 5/1986 |
| JP | 2004096118 | 3/2004 |

OTHER PUBLICATIONS

French Search Report from corresponding French Application No. 06/55981 filed Dec. 27, 2006.

* cited by examiner

*Primary Examiner*—N Drew Richards
*Assistant Examiner*—Yu-Hsi Sun
(74) *Attorney, Agent, or Firm*—Lisa K. Jorgenson; James H. Morris; Wolf, Greenfield & Sacks, P.C.

(57) ABSTRACT

A MOS transistor capable of withstanding significant currents, having doped areas corresponding to first and second main terminals of elementary MOS transistors and having, in top view, the shape of parallel strips separated by gate regions; first conductive elements which do not extend on the doped areas corresponding to the second main terminals and dividing into first fingers extending at least partly on the doped areas corresponding to the first main terminals and connected thereto; and second conductive elements which do not extend on the doped areas corresponding to the first main terminals and divide into second fingers extending at least partly on the doped areas corresponding to the second main terminals and connected thereto, the second fingers being at least partly intercalated with the first fingers.

17 Claims, 2 Drawing Sheets

MOS TRANSISTOR CAPABLE OF
// WITHSTANDING SIGNIFICANT CURRENTS

BACKGROUND OF THE INVENTION

1. Field of the Invention

The present invention relates to a metal-oxide semiconductor field-effect transistor structure (MOSFET) capable of withstanding significant currents.

2. Discussion of the Related Art

MOS transistors capable of withstanding significant currents are, for example, used for the switching of antennas, especially to transmit signals according to the global system for mobile communications (GSM).

Such a MOS transistor need to comply with several constraints:

it needs to enable transmission of currents having a magnitude that may exceed several hundreds of milliamperes;

the on-state series resistance of the transistor needs to be as low as possible;

the losses of the MOS transistor towards the substrate and the losses of the metal tracks, ensuring the connection of the MOS transistor, towards the substrate, especially due to stray capacitive couplings, needs to be as low as possible especially for applications for which the MOS transistor may be led to operate at frequencies greater than some gigahertzes; and the transistor manufacturing method needs to be compatible with conventional MOS transistor manufacturing techniques.

SUMMARY OF THE INVENTION

The present invention aims at a MOS transistor structure which enables at least partially complying with the above-mentioned constraints.

To achieve these and other objects, an embodiment of the present invention provides a MOS transistor capable of withstanding significant currents, comprising doped areas corresponding to first and second main terminals of elementary MOS transistors and having, in top view, the shape of parallel strips separated by gate regions; first conductive elements which do not extend on the doped areas corresponding to the second main terminals and dividing into first fingers extending at least partly on the doped areas corresponding to the first main terminals and connected thereto; and second conductive elements which do not extend on the doped areas corresponding to the first main terminals and divide into second fingers extending at least partly on the doped areas corresponding to the second main terminals and connected thereto, the second fingers being at least partly intercalated with the first fingers.

According to an embodiment, the transistor further comprises a first conductive track connecting the first conductive elements and a second conductive track connecting the second conductive elements.

According to an embodiment, the length of the doped areas is greater, by at least a factor 1.5, than the length of the gate regions.

According to an embodiment, each doped area is connected to one of the first or second fingers by two rows of vias.

According to an embodiment, the transistor is formed at the level of a circuit comprising a semiconductor substrate and metal tracks of at least one first and one second metallization levels, the metal tracks of the first metallization level being the closest to the substrate. Each first or second conductive element comprises at least first parallel metal tracks of the first metallization level, each first metal track corresponding to a first strip extending over all of one of the doped areas, and comprises second metal tracks of the second metallization level, each second metal track corresponding at least partly to a strip extending over less than three quarters of one of the first metal tracks.

According to an embodiment, each first or second conductive element comprises a third metal track of the second metallization level having the shape of a strip which divides, at least at one end, into said second metal tracks.

According to an embodiment, the semiconductor substrate is a semiconductor layer covering an insulating layer.

According to an embodiment, the semiconductor substrate corresponds to a semiconductor wafer of low resistivity or of high resistivity.

A transistor corresponding to the serial connection of at least two transistors such as defined hereabove is also provided.

The foregoing and other objects, features, and advantages of the present invention will be discussed in detail in the following non-limiting description of specific embodiments in connection with the accompanying drawings.

DETAILED DESCRIPTION

Figure 1:
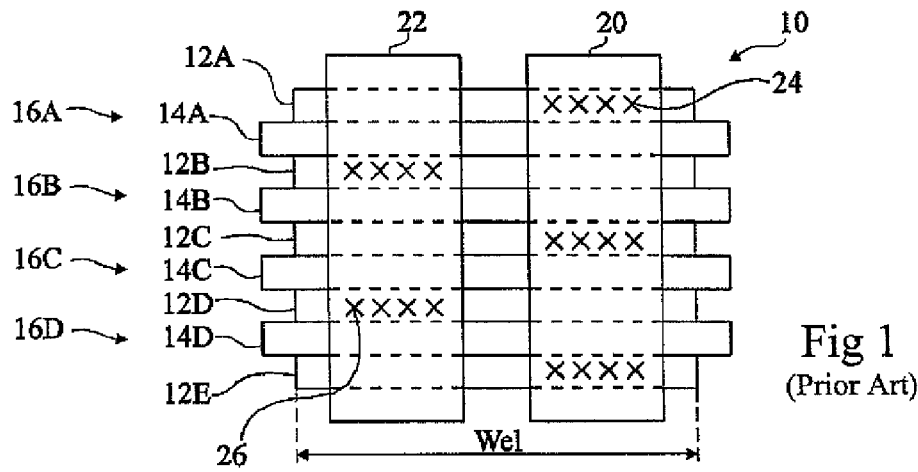
FIG. 1 is a simplified top view of a conventional MOS transistor capable of standing strong currents.

For clarity, the same elements have been designated with the same reference numerals in the different drawings and, further, as usual in the representation of integrated circuits, the various drawings are not to scale.

FIG. 1 is a simplified top view of a conventional MOS transistor 10, made in integrated form, capable of withstanding significant currents. MOS transistor 10 is formed by placing elementary MOS transistors in parallel. In FIG. 1, the contours of doped silicon areas formed in a single-crystal silicon substrate, of polysilicon regions covering the substrate, and of metal tracks have been shown. The dotted lines define the contour of polysilicon regions or doped areas located under metal tracks. Further, crosses show vias connecting metal tracks to doped areas.

MOS transistor 10 comprises doped areas having the shape of parallel strips 12A to 12E which are separated two-by-two by gate regions 14A to 14D. Four elementary MOS transistors 16A to 16D have thus been shown. The means for controlling the gates of elementary MOS transistors 16A to 16D are not shown.

The connection of the sources and drains of elementary MOS transistors 16A to 16D is performed by parallel metal tracks 20, 22 which extend perpendicularly to the longitudinal direction of doped areas 12A to 12E. Only two tracks 20, 22 are shown in FIG. 1, but more than two metal tracks may be provided. Track 20 is, for example, connected to drains 12A, 12C, and 12E of elementary MOS transistors 16A to 16D, via vias 24. Track 22 is, for example, connected to sources 12B and 12D of elementary MOS transistors 16A to 16D via vias 26. A parallel assembly of elementary MOS transistors 16A to 16D is thus obtained. Designating the gate width of an elementary MOS transistor with reference $W_{el}$, the equivalent gate length $W_{tot}$ of MOS transistor 10 corresponds to N times $W_{el}$, where N corresponds to the number of elementary MOS transistors forming MOS transistor 10. When elementary MOS transistors 16A to 16D are on, a current is, for example, conveyed by metal track 20, distributes at the level of transistors 16A to 16D, and is carried off by metal track 22.

The previously-described structure of MOS transistor 10 is capable of withstanding currents of high magnitude. It however has disadvantages.

Indeed, such a MOS transistor structure does not enable equally distributing the current between the elementary MOS transistors, which is desirable to avoid for some elementary MOS transistors to be urged more than others. In particular, the current which is conveyed by metal track 20 follows paths of increasing resistance to respectively reach drains 12A, 12C, and 12E. A more significant portion of the current thus risks propagating through transistor 16A than through transistors 16B, 16C, and 16D. This results in a risk of breakdown of elementary MOS transistor 16A or of vias 24, 26 connecting metal tracks 20, 22 to MOS transistors 16A.

Another disadvantage is that MOS transistor 10 exhibits high losses, especially when it is used at frequencies that may exceed one gigahertz. Indeed, metal track 20, connected to drains 12A, 12C, and 12E, runs above sources 12B and 12D. Losses by capacitive coupling can thus be observed between track 20 and sources 12B and 12D. Similarly, metal track 22, connected to sources 12B and 12D, runs above drains 12A, 12C, and 12E. Losses by capacitive coupling between track 22 and drains 12A, 12C, and 12E can thus be observed.

Embodiments of the present invention provide a MOS transistor structure which does not exhibit such disadvantages. For this purpose, the metal tracks which ensure the connection of the drains of the elementary MOS transistors comprise, at one end, fingers, connected to the drains, which do not run above the sources of the elementary MOS transistors. Further, the metal tracks which ensure the connections of the sources of the elementary MOS transistors comprise, at one end, fingers, connected to the sources, which do not run above the drains of the elementary MOS transistors. The fingers associated with the drains are thus intercalated with the fingers associated with the sources. This enables decreasing the losses due to parasitic couplings. Further, the comb shape of the metal tracks connected to the drains or to the sources of the elementary MOS transistors ensures that the path taken by the current to reach the drains of the elementary MOS transistors has substantially the same resistance whatever the elementary MOS transistor. This ensures an equal distribution of the current between the elementary MOS transistors.

Figure 2:
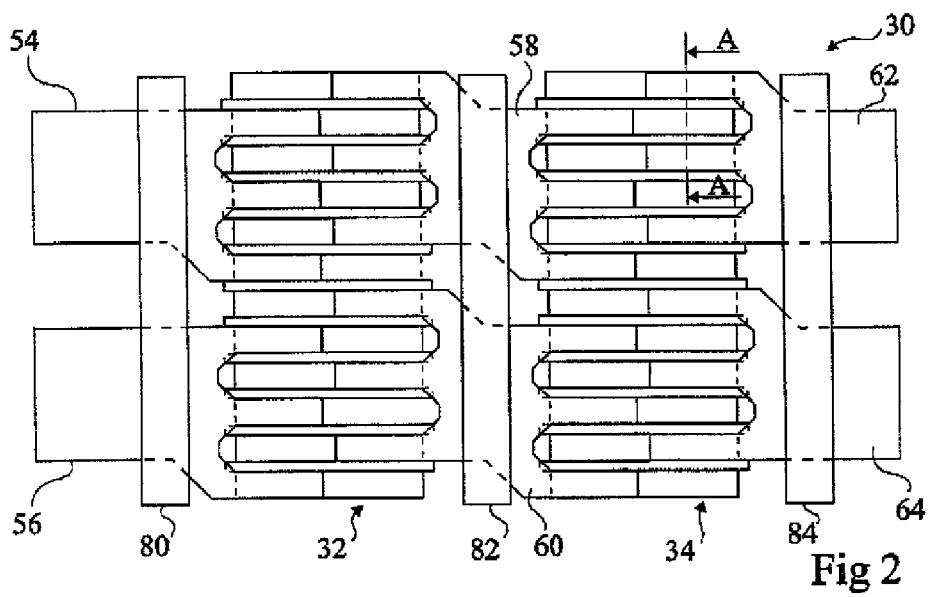
FIG. 2 is a simplified top view of an embodiment of a MOS transistor capable of standing strong currents.

FIG. 2 shows an embodiment of a MOS transistor 30. In the present example, MOS transistor 30 is formed at the level of an SOI-type substrate. An SOI substrate is formed of a thin single-crystal silicon layer insulated from a silicon wafer by an insulating layer, for example, silicon oxide. The electronic components are formed in the single-crystal silicon layer. In the present embodiment, the connection of the MOS transistor is obtained by metal tracks of six metallization levels.

MOS transistor 30 is formed, in the present example, by serially connecting two MOS transistors 32, 34, each corresponding to several elementary MOS transistors in parallel. Of course, MOS transistor 30 may correspond to the serial connection of more than two MOS transistors, each corresponding to several elementary MOS transistors in parallel, or only comprise a single MOS transistor corresponding to several elementary MOS transistors in parallel. The drawing conventions used for FIG. 2 are the same as for FIG. 1, the vias being however only shown in FIG. 2.

Figure 3:
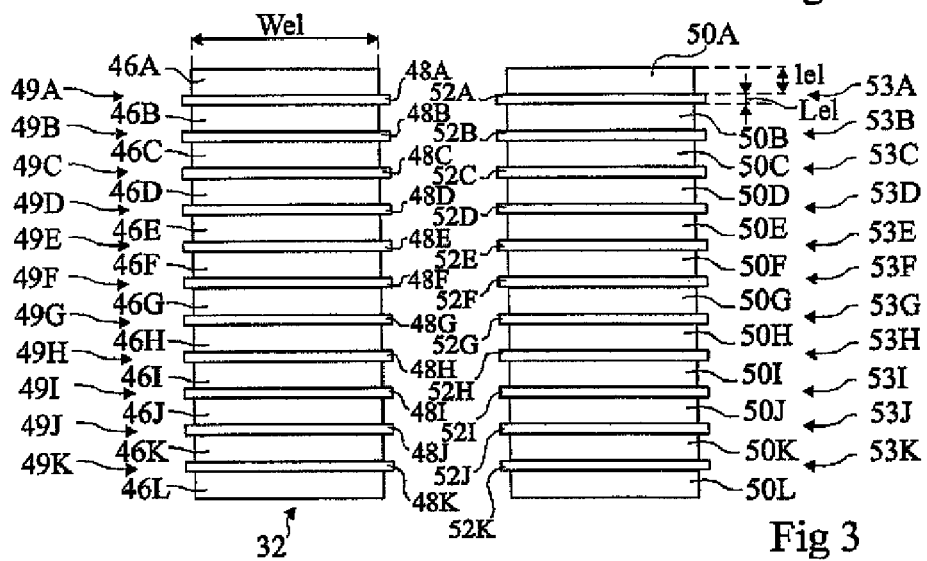
FIGS. 3, 4, and 5 are simplified top views of specific elements of the MOS transistor of FIG. 2.
Figure 4:
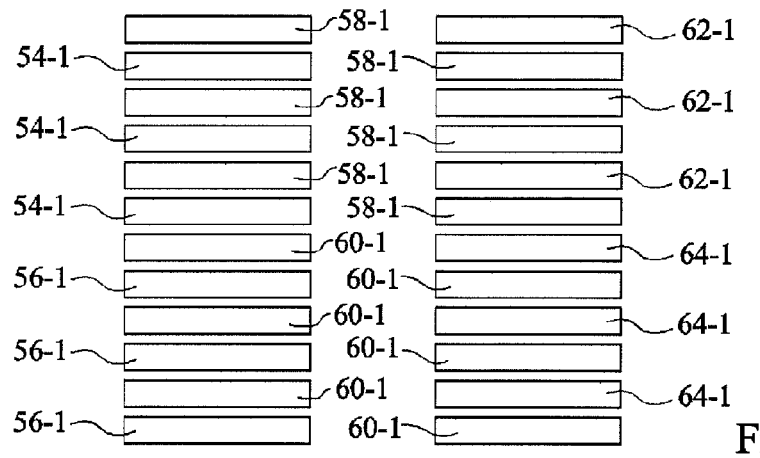
Figure 5:
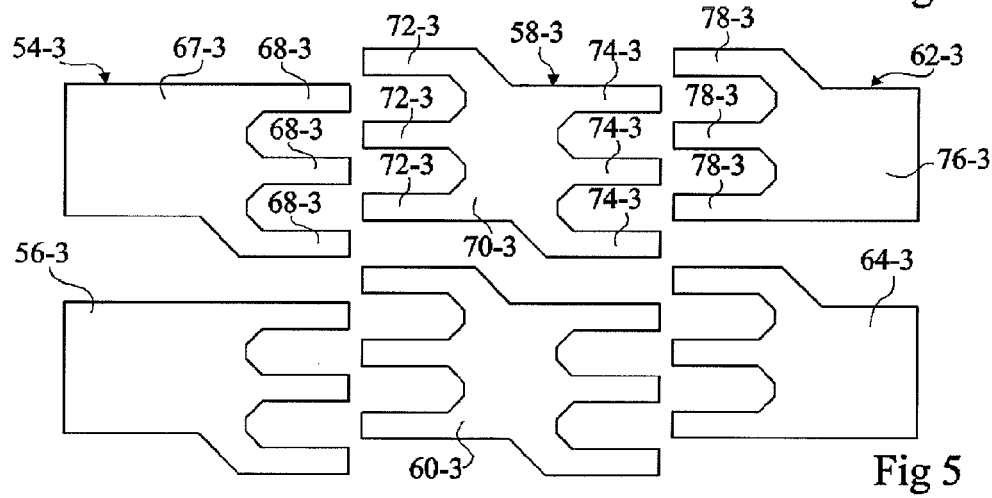

FIGS. 3, 4, and 5 are top views of transistor 30 of FIG. 2 for which, in FIG. 3, only the doped areas and the polysilicon regions associated with elementary MOS transistors have been shown, in FIG. 4, only the metal tracks of the first metallization level have been shown and, in FIG. 5, only the metal tracks of the third metallization level have been shown.

Figure 6:
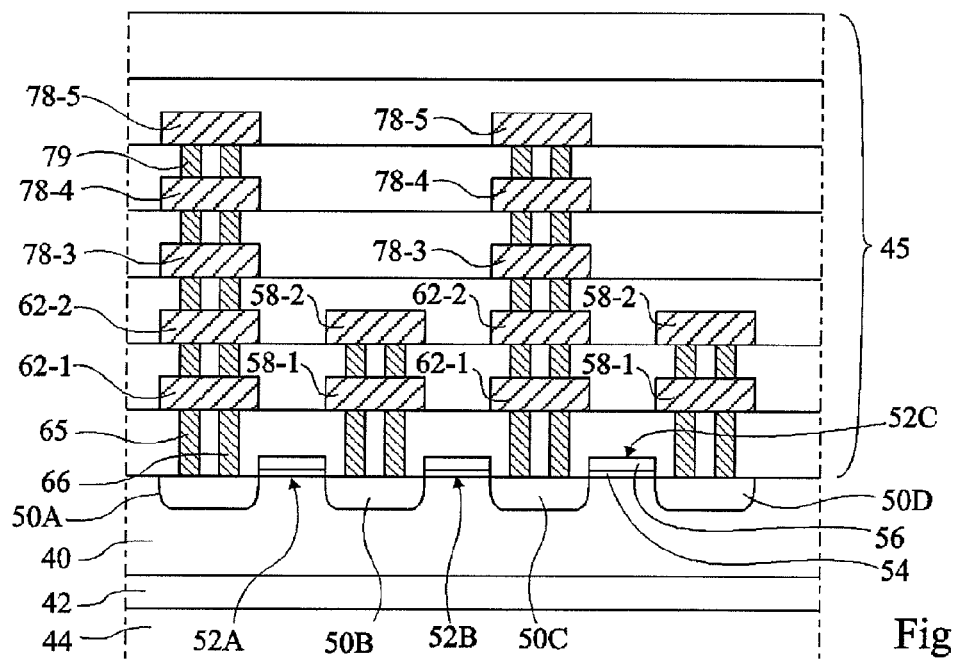
FIG. 6 is a partial simplified cross-section view of the MOS transistor of FIG. 2.

FIG. 6 is a partial simplified cross-section view of FIG. 2 along line A-A. As appears in this drawing, MOS transistor 30 is formed at the level of a substrate on insulator or SOI type 40. Substrate 40, for example, corresponds to a single-crystal silicon layer 40 covering an insulating layer 42, for example, a silicon oxide layer, itself covering a silicon wafer 44 of high or low resistivity. A stack of insulating layers 45 covers substrate 40, metal tracks of six metallization levels being provided at the stack level.

MOS transistor 32 comprises doped areas having the shape of parallel strips 46A to 46L which are separated two by two by gate regions 48A to 48K. More specifically, gate region 48A is interposed between doped areas 46A and 46B, gate region 48B is interposed between doped areas 46B and 46C, etc. Eleven elementary transistors 49A to 49K are thus obtained in the present example. More specifically, doped areas 46A and 46B correspond to the drain and to the source of transistor 49A, which will be called hereafter main terminals of the transistor, doped areas 46B and 46C correspond to the main terminals of transistor 49B, doped areas 46C and 46D correspond to the main terminals of transistor 49C, etc. Similarly, transistor 34 comprises doped areas having the shape of parallel strips 50A to 50L which are separated two by two by gate regions 52A to 52K defining eleven elementary MOS transistors 53A to 53K. Generally, each of MOS transistors 32, 34 may comprise several tens of elementary MOS transistors in parallel. Gate width $W_{el}$ of an elementary MOS transistor is, for example, on the order of some ten micrometers. Length $L_{el}$ of a gate region is, for example, on the order of a few tenths of a micrometer and length $l_{el}$ of a doped area is, for example, on the order of twice length $L_{el}$ of a gate region. As appears in FIG. 6, each gate region 48A to 48K and 52A to 52K corresponds to the stack of an insulating portion 54, corresponding to the gate oxide, and of a polysilicon portion 56 corresponding to the gate control.

In the following description, for explanation purposes, it is considered that main terminals 46A, 46C, 46E, 46G, 46I, 46K, 50A, 50C, 50E, 50G, 50I, 50K correspond to sources of elementary MOS transistors and that the other main terminals correspond to drains of elementary MOS transistors. The connection between a current supply source and drains 46B, 46D, and 46F is performed by a conductive element 54 and the connection between the current supply source and drains 46H, 46J, and 46L is performed by a conductive element 56. The connection between sources 46A, 46C, and 46E and drains 50B, 50D, and 50F is performed by a conductive element 58 and the connection between sources 46G, 46I, and 46K and drains 50H, 50J, and 50L is performed by a conductive element 60. The connection between sources 50A, 50C, and 50E and a load, not shown, is performed by a conductive element 62 and the connection between sources 50G, 50I, and 50K and the load is performed by a conductive element 64. Each conductive element corresponds to the stack of metal tracks, at least partly identical, from the first to the fifth metallization level, arranged above one another and connected together by vias. Hereafter, suffix "-1" to "-5" is added to the reference numeral of a conductive element to respectively designate a metal track from the first to the fifth metallization level associated with this conductive element.

FIG. 4 shows the metal tracks of the first metallization level which are associated with conductive elements 54, 56, 58, 60,

62, 64. The tracks of the second metallization level, associated with conductive elements 54, 56, 58, 60, 62, 64, are identical to the tracks of the first metallization level and are superposed thereto. Metal tracks 54-1 correspond to three parallel metal tracks which respectively extend across the entire width $W_{el}$ of drains 46B, 46D, and 46F and are connected thereto. Metal tracks 56-1 correspond to three parallel metal strips which respectively extend across the entire width $W_{el}$ of drains 46H, 46J, and 46L and are connected thereto. Metal tracks 58-1 correspond to three parallel metal strips which respectively extend across the entire width $W_{el}$ of drains 46A, 46C, and 46E and are connected thereto and to three parallel metal strips which respectively extend across the entire width $W_{el}$ of drains 50B, 50D, and 50F and are connected thereto. Metal tracks 60-1 correspond to three parallel metal strips which respectively extend across the entire width $W_{el}$ of drains 46G, 46I, and 46K and are connected thereto and to three parallel metal strips which respectively extend across the entire width $W_{el}$ of drains 50H, 50J, and 50L and are connected thereto. Metal tracks 62-1 correspond to three parallel metal strips which respectively extend across the entire width $W_{el}$ of sources 50A, 50C, and 50E and are connected thereto. Metal tracks 64-1 correspond to three parallel metal strips which respectively extend across the entire width $W_{el}$ of sources 50G, 50I, and 50K and are connected thereto.

As appears in FIG. 6, parallel strips 62-1 are connected to source regions 50A and 50C and parallel strips 58-1 are connected to drains 50B and 50D by two rows of vias 65, 66 each having, for example, a square or rectangular base. Such an arrangement of vias 65, 66 may be identical for all parallel strips 54-1, 56-1, 58-1, 60-1, 62-1, and 64-1.

FIG. 5 shows the metal tracks of the third metallization level which are associated with conductive elements 54, 56, 58, 60, 62, 64. The tracks of the fourth and fifth metallization levels, associated with conductive elements 54, 56, 58, 60, 62, 64, are identical to the tracks of the third metallization level and are superposed thereto. Track 54-3 comprises a main terminal 67-3 which extends in three parallel fingers 68-3. The three fingers 68-3 respectively extend across half of the width $W_{el}$ of parallel strips 54-1 associated with drains 46B, 46D, and 46F. Track 56-3 is identical to track 54-3 and is associated with drains 46H, 46J, and 46L. Track 58-3 comprises a central region 70-3 which extends on one side in three parallel fingers 72-3 which extend across half of width $W_{el}$ of parallel strips 58-1 associated with sources 46A, 46C, and 46E, central region 70-3 extending, on the opposite side, in three parallel fingers 74-3 which extend across half width $W_{el}$ of parallel strips 58-1 associated with drains 50B, 50D, and 50F. Track 60-3 is identical to track 58-3 and is associated with sources 46G, 46I, and 46K and with drains 50H, 50J, and 50L. Track 62-3 comprises a main branch 76-3 which extends in three parallel fingers 78-3. The three fingers 78-3 respectively extend across half of width $W_{el}$ of parallel strips 62-1 associated with sources 50A, 50C, and 50E. Track 64-3 is identical to track 62-3 and is associated with sources 50G, 50I, and 50K. Vias 79 which connect the tracks of a same conductive element to one another have been shown in FIG. 6.

As appears in FIG. 2, parallel tracks 80, 82, 84 of the sixth metallization level extend substantially perpendicularly to the longitudinal direction of doped areas 46A to 46L and 50A to 50L. Track 80 is connected to the tracks of the fifth metallization level of conductive elements 54 and 56. Track 82 is connected to the tracks of the fifth metallization level of conductive elements 58 and 60, and track 84 is connected to the tracks of the fifth metallization level of conductive elements 62 and 64. Tracks 80, 82, 84 enable maintaining conductive elements 54, 56, 58, 60, 62, 64 to which they are connected at the same voltage.

The present invention has many advantages.

First, parallel strips 54-1, 56-1, 58-1, 60-1, and fingers 68-3, 74-3 of the metal tracks of conductive elements 54, 56, 58, 60 associated with drains of elementary MOS transistors do not run above elementary MOS transistor sources. Similarly, parallel strips 58-1, 60-1, 62-1, 64-1 and fingers 72-3, 78-3 of the metal tracks of conductive elements 58, 60, 62, 64 associated with the sources of elementary MOS transistors do not run above drains of elementary MOS transistors. Parasitic losses by capacitive coupling between the metal tracks and the doped areas are thus decreased. Further, the fingers of the tracks of the third, fourth, and fifth metallization levels are not as long as the parallel strips of the tracks of the first and second metallization levels that they cover and to which they are connected. This enables further decreasing the stray capacitances between metal tracks.

Second, the comb shape of the ends of the conductive elements connected to the main terminals of the elementary MOS transistors ensures for the path followed by the current to a main terminal of an elementary MOS transistor to have substantially the same resistance whatever the elementary MOS transistor. An equal distribution of the current is thus obtained at the level of the elementary MOS transistors.

Third, the fact for doped areas 46A to 46L and 50A to 50L have a length $l_{el}$ on the order of twice length $L_{el}$ of gate regions 48A to 48L and 52A to 52L enables arranging two rows of vias 65, 66 which connect each doped area to a parallel strip 52-1, 54-1, 56-1, 58-1, 60-1, 62-1. This enables increasing the number of vias associated with each source/drain area of elementary MOS transistors. On a conventional MOS transistor structure, length $l_{el}$ of the source/drain areas is generally on the order of length $L_{el}$ of the gate region so that a single row of vias may be provided by a source/drain area. An increase in the number of vias associated with each source/drain area of the elementary MOS transistors enables decreasing the intensity of the current transiting through each of these vias 65, 66. Further, the present embodiment enables increasing the number of vias associated with each source/drain area without increasing gate width $W_{el}$. The increase in the number of vias can advantageously be obtained by keeping equivalent gate width $W_{tot}$ of MOS transistor 32, 34 and the number of elementary MOS transistors per transistor 32, 34. In the case where the substrate is of substrate-on-insulator type, the increase in length $l_{el}$ of the doped areas does not cause a significant increase in losses by parasitic coupling with substrate 40.

Of course, the present invention is likely to have various alterations, modifications, and improvements which will readily occur to those skilled in the art. In particular, the number of metallization levels used to ensure the connection of the elementary MOS transistors may be different from what has been described previously. Generally, this number will be adapted according to the intensity of the current to be run through the elementary MOS transistors.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A transistor structure, comprising:
   first terminals comprising first strips of semiconductor;

second terminals comprising second strips of semiconductor;
a first conductive element, comprising:
   a first plurality of elongated conductors formed in at least one first metallization level, wherein the first plurality of elongated conductors extend over the first strips of semiconductor; and
   a second plurality of elongated conductors formed in at least one second metallization level, wherein the second plurality of conductors partially extend over the first strips of semiconductor from a first side;
a second conductive element, comprising:
   a third plurality of elongated conductors formed in the at least one first metallization level, wherein the third plurality of elongated conductors extend over the second strips of semiconductor; and
   a fourth plurality of elongated conductors formed in the at least one second metallization level, wherein the fourth plurality of elongated conductors partially extend over the second strips of semiconductor from a second side,
wherein the at least one first metallization level comprises a first plurality of metallization levels.

2. The transistor structure of claim 1, wherein the first strips of semiconductor are parallel to the second strips of semiconductor.

3. The transistor structure of claim 1, wherein the first and second strips of semiconductor are arranged in rows that alternate between the first strips of semiconductor and the second strips of semiconductor.

4. The transistor structure of claim 1, wherein the first terminals are source regions of a MOS transistor and the second terminals are drain regions of the MOS transistor.

5. The transistor structure of claim 1, wherein the second plurality of elongated conductors extend for a first length over the first strips and the fourth plurality of elongated conductors extend for a second length over the second strips, and wherein a total of the first and second lengths is less than a length of the first strips of semiconductor.

6. The transistor structure of claim 5, wherein the first length is less than three quarters of the length of the first strips of semiconductor.

7. The transistor structure of claim 5, wherein the first length is equal to the second length.

8. The transistor structure of claim 1, further comprising:
   first vias extending from the first plurality of elongated conductors to the first strips of semiconductor; and
   second vias extending from the third plurality of elongated conductors to the second strips of semiconductor.

9. A transistor structure, comprising:
   first terminals comprising first strips of semiconductor;
   second terminals comprising second strips of semiconductor;
   a first conductive element, comprising:
      a first plurality of elongated conductors formed in at least one first metallization level, wherein the first plurality of elongated conductors extend over the first strips of semiconductor; and
      a second plurality of elongated conductors formed in at least one second metallization level, wherein the second plurality of conductors partially extend over the first strips of semiconductor from a first side;
   a second conductive element, comprising:
      a third plurality of elongated conductors formed in the at least one first metallization level, wherein the third plurality of elongated conductors extend over the second strips of semiconductor; and
      a fourth plurality of elongated conductors formed in the at least one second metallization level, wherein the fourth plurality of elongated conductors partially extend over the second strips of semiconductor from a second side,
   wherein the at least one second metallization level comprises a second plurality of metallization levels.

10. The transistor structure of claim 9, wherein the first strips of semiconductor are parallel to the second strips of semiconductor.

11. The transistor structure of claim 9, wherein the first and second strips of semiconductor are arranged in rows that alternate between the first strips of semiconductor and the second strips of semiconductor.

12. The transistor structure of claim 9, wherein the first terminals are source regions of a MOS transistor and the second terminals are drain regions of the MOS transistor.

13. The transistor structure of claim 9, wherein the second plurality of elongated conductors extend for a first length over the first strips and the fourth plurality of elongated conductors extend for a second length over the second strips, and wherein a total of the first and second lengths is less than a length of the first strips of semiconductor.

14. The transistor structure of claim 13, wherein the first length is less than three quarters of the length of the first strips of semiconductor.

15. The transistor structure of claim 13, wherein the first length is equal to the second length.

16. The transistor structure of claim 9, further comprising:
   first vias extending from the first plurality of elongated conductors to the first strips of semiconductor; and
   second vias extending from the third plurality of elongated conductors to the second strips of semiconductor.

17. The transistor structure of claim 9, wherein the at least one first metallization level comprises a first plurality of metallization levels.

* * * * *